(12) United States Patent
Hottgenroth

(10) Patent No.: US 6,545,625 B2
(45) Date of Patent: Apr. 8, 2003

(54) METHOD AND DEVICE FOR DATA EXCHANGE BETWEEN MEMORY AND LOGIC MODULES

(75) Inventor: Dirk Hottgenroth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,503

(22) Filed: Aug. 23, 2001

(65) Prior Publication Data

US 2002/0024457 A1 Feb. 28, 2002

(30) Foreign Application Priority Data

Aug. 23, 2000 (DE) .......................... 100 41 380

(51) Int. Cl.[7] .................. H03M 1/12; H03M 1/06
(52) U.S. Cl. .................. 341/155; 341/120; 341/144
(58) Field of Search .................. 341/155, 120, 341/119, 118, 56; 710/71; 370/535; 380/54

(56) References Cited

U.S. PATENT DOCUMENTS

| | | | | |
|---|---|---|---|---|
| 4,821,321 A | * | 4/1989 | Bramley | 380/54 |
| 4,958,344 A | * | 9/1990 | Scott | 370/535 |
| 5,055,847 A | | 10/1991 | Rybicki et al. | 341/162 |
| 5,153,592 A | * | 10/1992 | Fairchild et al. | 341/118 |
| 5,414,830 A | * | 5/1995 | Marbot | 710/71 |
| 5,946,355 A | * | 8/1999 | Baker | 341/56 |

FOREIGN PATENT DOCUMENTS

| DE | 27 32 603 C3 | 10/1980 |
|---|---|---|
| EP | 0 407 031 B1 | 1/1991 |

* cited by examiner

Primary Examiner—Peguy Jeanpierre
Assistant Examiner—Jean Bruner Jeanglaude
(74) Attorney, Agent, or Firm—Laurence A. Greenberg; Werner H. Stemer; Ralph E. Locher

(57) ABSTRACT

The method and the device are particularly suitable for data exchange between memory modules and logic modules. A multidigit digital signal at the transmitter end is converted into a corresponding analog signal by a D/A converter. The analog signal is transferred via a transfer line and the analog signal received at the transmitter end is converted back into a digital signal identical to the digital signal of the transmitter end with an A/D converter. An A/D converter based on the principle of successive approximation is used at the receiver end. The converter has a calibration circuit which, during a calibration cycle, by way of an additional "overdrive" transistor and a register, varies gate voltages of the transistors used for decoding purposes until the output signal of a comparator disappears.

11 Claims, 2 Drawing Sheets

METHOD AND DEVICE FOR DATA EXCHANGE BETWEEN MEMORY AND LOGIC MODULES

BACKGROUND OF THE INVENTION

Field of the Invention

The invention relates to a method and a device in particular for data exchange between memory and logic modules.

The transfer rate of (memory) information from a memory module to a processor, and vice versa, is currently a main factor for the limitation in the performance of computers. While modern processors achieve frequencies of 800 MHz and corresponding transfer rates, the frequencies for the data exchange between processor/controller and memory are, for technical reasons, currently 100 to at most 133 MHz. Therefore, new circuits and/or methods are urgently being sought in order to diminish the significance of this limiting factor and to utilize the high processor frequencies in the application as well.

Previous methods for increasing the transfer rate are essentially based on two principles:

(A) First, increases of the data transfer are sought through parallelism: that means a higher number of pins of the interface between the modules. The data transfer rate behaves linearly with respect to the number of pins.

(B) Second, increases are sought by increasing the clock frequency during the transfer, either by increasing the clock frequency in the processor and in the memory module or by utilizing the leading and trailing edges of the signal for transferring a respective information unit.

The former again leads to a transfer rate that rises linearly with frequency; the latter leads to an increase by the factor 2. In this case, the "real" frequency on the data pins in the case of continually changing data is also twice as high.

The first above-outlined concept is used, for example, in memory DIMMs and can only be implemented in a limited fashion owing to the high space requirement of many lines, e.g. on a motherboard of a computer, and on account of the number of interface pins which is limited by the IC size. Moreover, the costs for the motherboards and/or the IC packages greatly increase when there are many lines. The mutual influencing of the signals greatly increases and the transfer reliability thus decreases. If a plurality of memory modules are used in parallel on a module in order that the number of pins of an individual module is kept low, then the minimum memory size of the module greatly increases: e.g. nine 256 MBit modules each having eight data lines yield a bus width of 72 bits but constitute a minimum memory amount ("granularity") of 256 Mbytes (with error correction). This is unnecessary and too expensive for many low-cost applications.

The second above-outlined concept is utilized, for example, in direct Rambus DRAMs, double data rate SDRAMs, and allows a lower number of pins and thus theoretically a lower granularity. In return, however, there is a radical increase in the requirements imposed on the temporal accuracy of all the modules involved. In particular, the data transfer is difficult via a relatively long bus system (tens of centimeters) with low-quality printed signal lines. In the case of direct Rambus, the requirements imposed on the timing accuracy of the memory modules therefore have to be radically raised, which makes the production and testing of these modules difficult and expensive and reduces the yield.

SUMMARY OF THE INVENTION

It is accordingly an object of the invention to provide a method and a device for data exchange in particular between memory and logic modules, which overcomes the above-mentioned disadvantages of the heretofore-known devices and methods of this general type and which makes possible further increases in the data transfer rate without resulting in the problems outlined above.

With the foregoing and other objects in view there is provided, in accordance with the invention, a method for data exchange, particularly between memory modules and logic modules, which comprises:

converting, at a transmitter end, a given multidigit digital signal into a corresponding analog signal;

transmitting the analog signal to a receiver end; and converting, at the receiver end, the analog signal into a multidigit digital signal identical to the given multidigit digital signal of the transmitter end.

In accordance with an added feature of the invention, a plurality of received analog signals are stored at the receiver end and the analog signals are processed using time division multiplexing.

In accordance with an additional feature of the invention, at the receiver end, the digital signal converted from the received analog signal is calibrated with regard to at least one signal value. Preferably, this is the maximum signal value.

In accordance with another feature of the invention, influences of attenuation between the transmitter end and the receiver end are eliminated by the calibration at the receiver end. In a preferred mode, the calibration at the receiver end utilizes a linearity of the analog signal fed into the receiver end.

With the above and other features in view there is provided, in accordance with the invention, a device for data exchange between a transmitter and a receiver, such as a memory module and a logic module. The device comprises:

a digital/analog converter at the transmitter, the digital/analog converter converting a plurality of bit positions of a multidigit digital signal into a corresponding analog signal;

a transfer link configured to transmit the analog signal to the receiver; and an analog/digital converter at the receiver end, the analog/digital converter converting the analog signal back into a multidigit digital signal identical to the multidigit digital signal at the transmitter.

In accordance with again an added feature of the invention, the analog/digital converter includes a capacitor for briefly storing a respective voltage state of the received analog signal, and the capacitor is subsequently discharged via a constant-current source; and a concurrent counter is configured to decode the signal by measuring a time required for the capacitor to be discharged.

In accordance with again an additional feature of the invention, the analog/digital converter operates according to the principle of successive approximation and has an internal D/A converter, whose analog output value is compared by a comparator with the received analog signal to be decoded and is adjusted until a resulting analog signal and the analog signal transmitted by the transmitter have the same magnitude.

In accordance with again another feature of the invention, the internal D/A converter of the analog/digital converter has a calibration device configured to calibrate the digital signal, generated for the comparison, for at least one value of the analog input signal.

In accordance with a concomitant feature of the invention, the calibration device in the D/A converter of the successive approximation analog/digital converter has a plurality of transistors and an additional overdrive transistor having a saturation current exactly half of a saturation current of a transistor corresponding to a least significant bit position of the converted digital signal, and means for adjusting, in dependence on a magnitude of a calibration signal transmitted by the transmitter, respective currents flowing through the transistors of the D/A converter of the successive approximation analog/digital converter in fine steps until the analog signal received as calibration signal and the comparison calibration signal generated by the D/A converter of the successive approximation analog/digital converter are virtually identical.

In a general form, in the method according to the invention, a D/A converter is required at the respective transmitter end, which converts a plurality of bits (digital states) for the transfer via a transfer link (bus system) into an analog state (a current or a voltage). This conversion has to be reversed at the receiver end, with the result that the digital signal obtained from the received analog signal by analog/digital conversion at the receiver end is identical to the transmitted digital signal.

Digital/analog converters which are suitable for the abovementioned purpose are known. Likewise, there are simple analog/digital converters, e.g. those which operate according to the following principles: the storage of a voltage state in a capacitor and subsequent discharge of the capacitor via a constant-current source, the decoding being effected by a concurrent counter which measures the time required for the discharge, or a successive approximation: in this case, at the receiver end, a D/A converter is used in the A/D converter and its analog output value is compared with the analog signal to be decoded and is adjusted until the resulting signal and the signal received from the transmitter have the same magnitude. This principle of the successive approximation A/D converter has the advantage that it can be calibrated relatively easily.

For the above procedure (A), the method presented here and the device can reduce the number of required pins by a factor k (integer) which corresponds to the number of bits of the digital signal which are encoded into an analog state. In the case (B), for the same operating frequency, the signal transfer rate can be increased by the factor k or, given a constant transfer rate, the frequency can be reduced by the factor k.

With an increased bandwidth, the method according to the invention allows a plurality of modules to use the same bus line, as previously in the case of SDRAM, EDORAMs, direct Rambus, in that all modules not read at a point in time switch their outputs to "high impedance". The level of the bus line is then determined solely by the level driven by the active module. In other words, the system is compatible with existing bus systems.

Since the decoding of an analog value at the receiver end requires some time, it is advantageous to use a plurality of decoders, i.e. A/D converters, per pin on a chip and to time division multiplex the input signals between them. This would enable a further increase in the bandwidth as long as the physical properties of the bus system do not entail a limitation thereof. To that end, the analog input signal has to be briefly buffer-stored, e.g. in capacitors.

In a development, a successive approximation analog/digital converter to be used at the receiver end has a calibration device which carries out a simple calibration on the basis of at least one input signal while at the same time avoiding a discretization error.

It goes without saying that the method according to the invention and the device designed for implementing it are not restricted to data transfer between memory and logic modules, but rather can advantageously be used wherever considerable limitations of the transfer rate could previously be observed in the transfer of digital data.

Other features which are considered as characteristic for the invention are set forth in the appended claims.

Although the invention is illustrated and described herein as embodied in a Method and device for data exchange between memory and logic modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
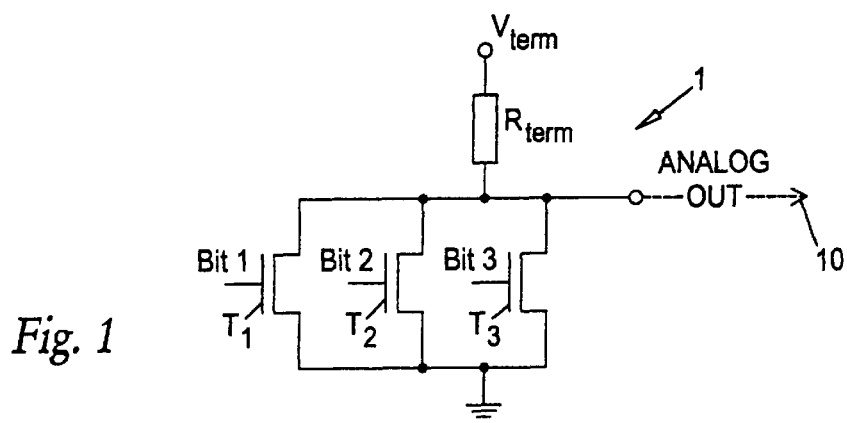
FIG. 1 is a diagram of an exemplary embodiment of a 3-bit D/A converter for generating an analog output signal.

Referring now to the figures of the drawing in detail and first, particularly, to FIG. 1 thereof, there is shown a simple realization of a multilevel driver forming a D/A converter. A plurality of parallel driver paths each have at least one n-channel FET T1, T2, and T3 for 3-bit positions Bit1, Bit2 and Bit3, which draw current from a terminating voltage $V_{term}$ via a resistor $R_{term}$. The saturation currents of these paths behave like powers of two. In the exemplary embodiment illustrated in the figure, the driver current intensities are in the ratio Bit1:Bit2:Bit3=4:2:1. The output signal OUT is a current (voltage swing) which corresponds to a digital value having n bit positions. The number of bits that can actually be coded depends on the measurement resolution during decoding at the receiver end and also e.g. on the magnitude of possible interference signals on the bus, as are caused by crosstalk of other lines on the level to be evaluated.

The analog value generated by a D/A converter circuit e.g. in accordance with FIG. 1 is transmitted via a transfer or bus line 10 to the receiver end.

Figure 2:
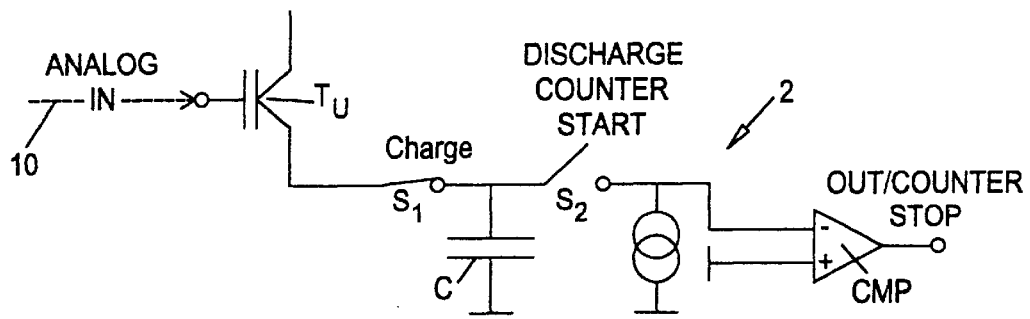
FIG. 2 is a diagram of a first exemplary embodiment of a simple A/D converter for converting an analog input signal into a digital signal.
Figure 2:
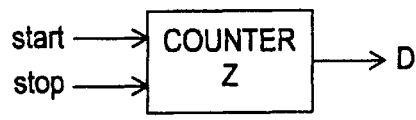

Situated at the receiver end is an A/D converter, which may be, for instance, an analog/digital converter 2 as illustrated in FIG. 2.

The A/D converter shown in FIG. 2 has a capacitor C which is charged to a (buffered) copy of the voltage swing from the transfer line 10 (the analog driver signal). The capacitor C preferably has a large capacitance with a correspondingly large charging current in order to obtain a large signal, namely the stored quantity of charge. For decoding, the capacitor C is isolated from the input by a switch S1 and discharged by a constant-current source $I_{const}$ after the closing of a switch S2. The digital value is produced by a concurrent counter Z which is clocked at a fixed clock frequency and has a number of bits corresponding to that of the digital signal and measures the time for the discharge of the capacitor. This means that the counter Z starts to count with the closing of the switch S2 and stops when a comparator CMP generates an output signal "OUT". The digital value which can be derived from the counter Z corresponds to the quantity of charge on the capacitor C and, when the latter has a defined capacitance, is proportional to the voltage swing at the analog input signal "ANALOG-IN".

It will be understood that the principle of the A/D converter shown in FIG. 2 is known to those skilled in the art.

In order to calibrate the converter shown in FIG. 2, the driver can be caused to drive the full signal (all bits on) either once after the switching-on of the relevant module or else periodically. The measurement operation on the capacitor can then be repeated and, depending on whether or not a complete discharge of the capacitor C is ascertained in the case of the counter reading "all bits on", the discharge current can be lowered or increased until complete discharge is achieved precisely for the counter value "all bits on". Instead of the discharge current, it is also possible to vary the clock frequency of the counter in this case.

As an alternative, for calibration, the capacitor C can also be completely discharged only once and a counter having a larger number of bits than are actually to be decoded can run concomitantly. In the case of full discharge, said counter must have at least twice the value, i.e. a full bit more of the desired counter reading "all bits on" and run correspondingly rapidly. It is then possible to convert this counter value during operation by computation or by circuitry to the desired value "all bits on" or correspondingly small values in the case of smaller input values.

More accurate calibration would be possible if this method were carried out for a plurality or even all of the possible discretization values.

This "excessively fast" counter would also partly solve the problem of the discretization error, which means that the least significant bit cannot be unambiguously ascertained, and in the extreme case can lead to a carry into all the more significant bits.

The exemplary embodiments—described below with reference to FIGS. 3 to 5—of a further A/D converter which can be used in the invention operated according to the principle of successive approximation.

Figure 3:
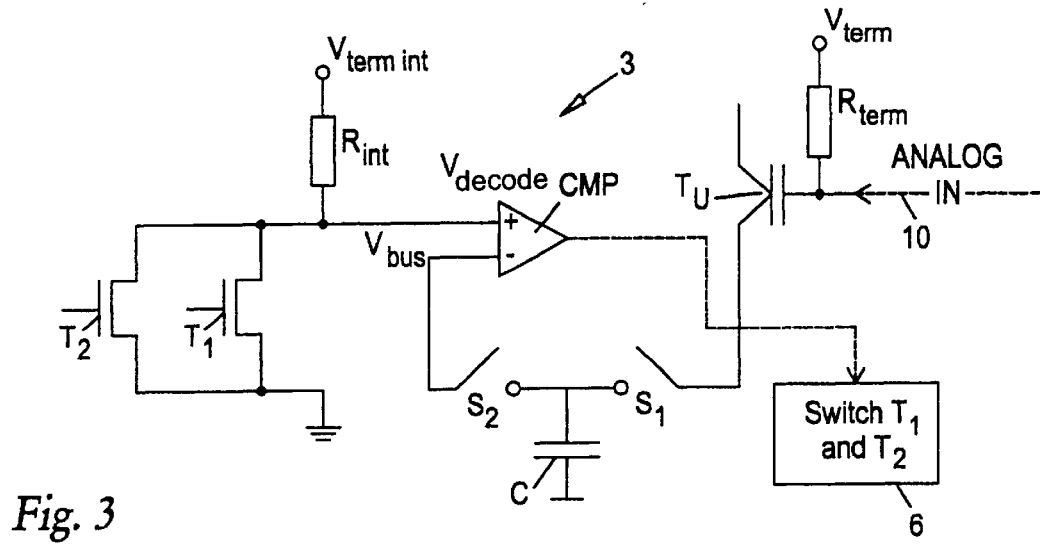
FIG. 3 is a schematic diagram of a first exemplary embodiment of an A/D converter operating according to the principle of successive approximation and serving for converting an analog signal into a digital signal with two bit positions.

First of all, the basic schematic diagram in FIG. 3 will be used to describe the method of successive approximation with the 2-bit A/D converter 3 illustrated.

The analog input voltage $V_{bus}$ from the bus line system 10 is produced across a terminating resistor $R_{term}$ as a voltage drop with respect to a voltage $V_{term}$. The voltage $V_{bus}$ on the bus line is applied to a capacitor C via a voltage follower $T_u$ for a specific time (order of magnitude ns) through the closing of a switch S1. The capacitor serves as a (short-term) store for the voltage. The switch S1 is then opened in order that the capacitor C is decoupled from the input of the circuit, and, through the closing of a switch S2, the capacitor C is connected to a first input of a differential amplifier CMP operating as a comparator.

The second input of the differential amplifier CMP, i.e. $V_{decode}$, is connected to an internal voltage $V_{term,int}$ via a resistor $R_{int}$. To ensure that the current consumption of the circuit is kept low, $R_{int}$ should generally be much higher than $R_{term}$.

In order to decode two bits, two transistors T2 and T1 are used whose saturation currents are in the ratio of 2:1. A calibration described further below using the exemplary embodiment in accordance with FIG. 4 is intended to ensure that when both transistors T1, T2 are switched on, the voltage drop across $R_{int}$ is approximately equal to the maximum voltage drop on the bus $V_{bus,max}$. The decoded digital value can then be derived from the state of the gate voltages of the transistors. Both gate voltages "high" corresponds to "1 1", gate of T2 "high" and that of T1 "low" corresponds to "1 0", and so on.

Figure 5:
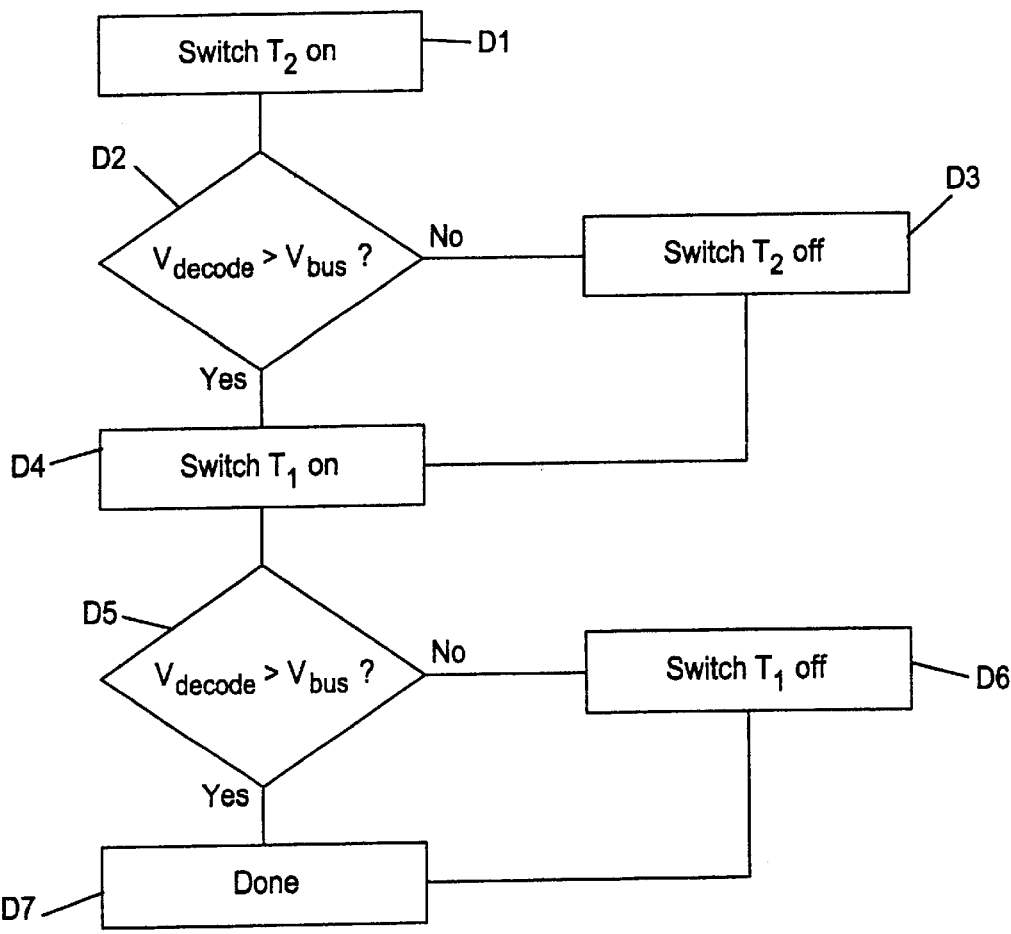
FIG. 5 is a flow diagram for analog/digital conversion into a 2-bit value by successive approximation of an A/D converter in accordance with FIG. 3.

FIG. 5 uses a flow diagram to show the temporal sequence for the decoding of a 2-bit digital signal from an analog signal $V_{bus}$ of the A/D converter illustrated in FIG. 3, implemented by a control block 6. In a step D1, the transistor T2 is switched on. A voltage drop is produced across $R_{int}$, and $V_{decode}$ is present at the comparator CMP. In step D2, an interrogation is made to determine whether $V_{decode}$ is greater than $V_{bus}$. In the affirmative case, the more significant bit 2 remains set and the transistor T2 remains switched on. Transistor T1 is then turned on. If $V_{decode}$ is not greater than $V_{bus}$, in step D3 transistor T2 is switched off (step D3) and transistor T1 is switched on (step D4). Furthermore, if $V_{decode}$ is greater than $V_{bus}$ (step D5), then the maximum value is decoded and the routine is ended in step D7. The decoded value must read "1 1" in this case. If the decision step D5 reveals that $V_{decode}$ is not greater than $V_{bus}$, T1 is switched off. Either the state "1 0" or "0 0" is then produced as the decoded state in D7, depending on the result determined in step D2.

As mentioned, the decoded digital value is finally produced from the state of the transistor gates (high="1", low="0") at the end of the two-stage decoding operation illustrated in FIG. 5.

This circuit evidently has a fundamental problem if it is used for decoding an analog voltage which was itself generated by a 2-bit D/A converter: if the voltage swing $V_{bus}$ which is produced by the setting of a bit (e.g. bit 1) in the original signal is exactly identical to that which is produced by the switching of one of the transistors in the A/D converter (e.g. T1), the differential amplifier CMP cannot decide whether or not the corresponding bit in the decoded signal is to be set.

Figure 4:
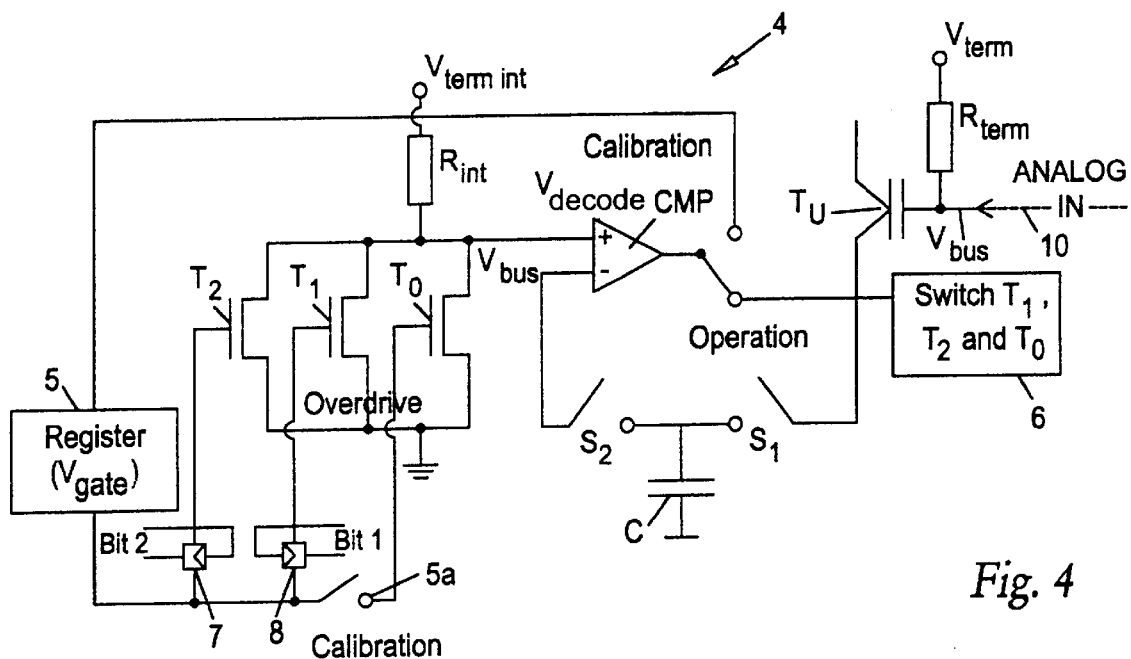
FIG. 4 is a schematic diagram of a further exemplary embodiment of a 2-bit A/D converter operating according to the principle of successive approximation and having an additional overdrive transistor for unambiguous decoding of an analog signal and an additional calibration circuit.

In the exemplary embodiment—illustrated in FIG. 4—of an A/D converter 4 which is based on successive approximation and is based on the basic circuit 3 that has just been described and is shown in FIG. 3, it is proposed, therefore, to use an additional transistor T0 "overdrive", to be precise such that its saturation current is precisely half that of the transistor T1, i.e. the current of the three transistors T2, T1 and T0 are in the ratio of 4:2:1.

As mentioned above, the additional "overdrive" transistor T0 produces the unambiguity of the decoded (2-bit) digital signal with the (2-bit) digital signal converted into an analog signal $V_{bus}$ at the transmitter end.

Furthermore, a calibration can be carried out in a simple manner using the A/D converter circuit 4 shown in FIG. 4. Moreover, an unambiguous decision can be made as to whether or not a bit in the original digital signal was set prior to the conversion into an analog signal.

The calibration is carried out in a particular calibration cycle. To that end, the most significant bit is set at the transmitter end, and, at the receiver end, switches S3 and S4 are moved to the position "calibration" and transistor 2 and, in addition, the "overdrive" transistor T0 are switched on by the control block 6. The output of the differential amplifier CMP acts on a register 5, with which the value of the gate voltage $V_{gate}$ of the transistors T2 and T1 (via the transfer gates 7 and 8) and of the "overdrive" transistor T0 can be adjusted in fine steps. If $V_{bus.2}$ is greater than $V_{decode}$, the register value and thus $V_{gate}$ should be increased. If $V_{bus.2}$ is less than $V_{decode}$, the register value and thus $V_{gate}$ should be decreased. Thus, the transistors T1 and T2 are not switched on with a full high level on the gate but rather by a gate voltage which can be adjusted by the voltage $V_{gate}$ of the register 5. The on/off signal is merely switched to a transfer gate 7, 8 which connects the transistor gates to the adjustable voltage $V_{gate}$.

The voltage $V_{gate}$ of the register 5 is adjusted until a certain threshold for the magnitude of the output voltage of the differential amplifier CMP is undershot, i.e. $V_{bus}$ and $V_{decode}$ are virtually identical. For reliable evaluation, it is also possible to utilize the output voltage of the amplifier CMP, whereby the voltage is integrated over a certain time. However, the calibration operation takes longer as a result of this.

During this calibration method, the "overdrive transistor T0" ensures that, at the receiver end, i.e. at the A/D converter 4, somewhat more current must be drawn than through T2 alone, in order that the differential amplifier CMP has a vanishing output signal, namely the current contribution supplied by the "overdrive" transistor T0. If the "overdrive" transistor T0 is always left switched off during normal decoding operation, then it is always the case that if a bit was set in the original signal prior to D/A conversion in the transmitter, said bit is also set in the above-described A/D converter 4 shown in FIG. 4, this being revealed in the above description of the decoding.

The principle described can, of course, be extended to k bits, the transistors Tk, T(k−1), . . . , T1, T0 having to have saturation currents in the ratio 2(k+1):2 k: . . . :2:1. This can easily be achieved during the production of a circuit by connecting a corresponding number of identical transistors in parallel.

The calibration can be refined/checked if not only the most significant bit is set in the original signal, rather the operation is repeated for different bits or else bit combinations. However, this prolongs the calibration cycle.

The calibration at the receiver end eliminates influences of possible attenuation between transmitter end and receiver end. This is due to the fact that correct decoding is carried out at the receiver end even when the analog signal transferred from the transmitter end arrives only in attenuated form as input signal at the receiver end. This is because the calibration utilizes only the linearity of the input signal at the receiver end with respect to the transmitted signal, and not an identity of absolute values of the transmission signal output by the transmitter end with the signal arriving at the receiver.

I claim:

1. A method for data exchange, which comprises:
   converting, at a transmitter end, a given multidigit digital signal into a corresponding analog signal;
   transmitting the analog signal to a receiver end; and
   converting, at the receiver end, the analog signal back into a multidigit digital signal identical to the given multidigit digital signal of the transmitter end, according to a principle of successive approximation including:
   comparing the analog output value of the internal D/A converter with the analog signal value received from the transmitter to be decoded by a comparator;
   adjusting an analog output value of an internal D/A converter until the analog output value of the internal D/A converter and the analog signal value transmitted by the transmitter have the same magnitude;
   calibrating the digital signal, generated for the comparison, for at least one value of the analog input signal;
   providing a calibration device of the internal D/A converter having with a plurality of transistors and an additional overdrive transistor with a saturation current being exactly half of a saturation current of a transistor corresponding to a least significant bit position of the converted digital signal; and
   adjusting, in dependence on a magnitude of a calibration signal transmitted by the transmitter, respective currents flowing through the transistors of the D/A converter of the successive approximation analog/digital converter in fine steps until the analog signal received as a calibration signal and the comparison calibration signal generated by the D/A converter of the successive approximation analog/digital converter are virtually identical.

2. The method according to claim 1, which comprises transmitting the analog signal between a memory module and a logic module.

3. The method according to claim 1, which comprises, at the receiver end, storing a plurality of received analog signals and processing the analog signals using time division multiplexing.

4. The method according to claim 1, which comprises calibrating, at the receiver end, the digital signal converted from the received analog signal, with regard to at least one signal value.

5. The method according to claim 4, which comprises calibrating the digital signal to a maximum signal value.

6. The method according to claim 4, which comprises eliminating influences of attenuation between the transmitter end and the receiver end by the calibration at the receiver end.

7. The method according to claim 4, wherein the step of calibrating at the receiver end utilizes a linearity of the analog signal fed into the receiver end.

8. A device for data exchange between a transmitter and a receiver, the device comprising:
   a digital/analog converter at the transmitter, said digital/analog converter converting a plurality of bit positions of a multidigit digital signal into a corresponding analog signal;
   a transfer link configured to transmit the analog signal to the receiver; and
   an analog/digital converter at the receiver end, said analog/digital converter converting the analog signal back into a multidigit digital signal identical to the multidigit digital signal at the transmitter, said analog/digital converter operating according to a principle of successive approximation and having a comparator and an internal D/A converter, said internal D/A converter having an analog output value being compared by said comparator with the received analog signal to be decoded and adjusted until a resulting analog signal and the analog signal transmitted by the transmitter have the same magnitude, said internal D/A converter having a calibration device configured to calibrate the digital signal, generated for the comparison, for at least one value of the analog input signal, said calibration device having a plurality of transistors and an additional overdrive transistor having a saturation current exactly half of a saturation current of a transistor corresponding to a least significant bit position of the converted digital signal, and means for adjusting, in dependence on a magnitude of a calibration signal transmitted by the transmitter, respective currents flowing through said transistors of said D/A converter of said successive approximation analog/digital converter in fine steps until the analog signal received as a calibration signal and the comparison calibration signal generated by said D/A converter of said successive approximation analog/digital converter are virtually identical.

9. The device according to claim 8, wherein the transmitter and the receiver are selected from the group of modules consisting of memory modules and logic modules.

10. The device according to claim 8, wherein said analog/digital converter includes a capacitor for briefly storing a respective voltage state of the received analog signal, and said capacitor is subsequently discharged via a constant-current source; and a concurrent counter is configured to decode the signal by measuring a time required for said capacitor to be discharged.

11. A successive approximation analog/digital converter, comprising a comparator and an internal D/A converter, said internal D/A converter having an analog output value being compared by said comparator with the received analog signal to be decoded and adjusted until a resulting analog signal and the analog signal transmitted by the transmitter have the same magnitude, said internal D/A converter having a calibration device configured to calibrate the digital signal, generated for the comparison, for at least one value of the analog input signal, said calibration device having a plurality of transistors and an additional overdrive transistor having a saturation current exactly half of a saturation current of a transistor corresponding to a least significant bit position of the converted digital signal, and means for adjusting, in dependence on a magnitude of a calibration signal transmitted by the transmitter, respective currents flowing through said transistors of said D/A converter of said successive approximation analog/digital converter in fine steps until the analog signal received as a calibration signal and the comparison calibration signal generated by said D/A converter of said successive approximation analog/digital converter are virtually identical.

* * * * *